(12) United States Patent
Tanabe et al.

(10) Patent No.: US 7,138,303 B2
(45) Date of Patent: Nov. 21, 2006

(54) METHOD FOR MANUFACTURING A THIN FILM TRANSISTOR HAVING HIGH MOBILITY AND HIGH ON-CURRENT

(75) Inventors: Hiroshi Tanabe, Tokyo (JP); Hiroshi Haga, Tokyo (JP)

(73) Assignee: NEC Corporation, Tokyo (JP)

(*) Notice: Subject to any disclaimer, the term of this patent is extended or adjusted under 35 U.S.C. 154(b) by 176 days.

(21) Appl. No.: 10/815,393

(22) Filed: Apr. 1, 2004

(65) Prior Publication Data

US 2004/0185641 A1 Sep. 23, 2004

Related U.S. Application Data

(62) Division of application No. 09/988,962, filed on Nov. 19, 2001, now abandoned.

(30) Foreign Application Priority Data

Nov. 20, 2000 (JP) ............................ 2000-353031

(51) Int. Cl.
*H01L 21/00* (2006.01)
(52) U.S. Cl. ............... 438/149; 438/150; 257/E27.112; 257/59; 257/291; 257/E21.347; 257/E21.475; 257/E21.596
(58) Field of Classification Search ................ 438/149, 438/150
See application file for complete search history.

(56) References Cited

U.S. PATENT DOCUMENTS

| 4,528,480 | A | | 7/1985 | Unagami et al. |
| 5,776,803 | A | * | 7/1998 | Young ........................ 438/149 |
| 6,025,217 | A | * | 2/2000 | Kanaya et al. .............. 438/166 |
| 6,177,301 | B1 | | 1/2001 | Jung |
| 6,184,541 | B1 | | 2/2001 | Oka et al. |
| 6,479,837 | B1 | | 11/2002 | Ogawa et al. |
| 6,504,175 | B1 | * | 1/2003 | Mei et al. ..................... 257/66 |

FOREIGN PATENT DOCUMENTS

| JP | 06252398 A | * | 9/1994 |
| JP | 08-288515 | | 11/1996 |
| JP | 2000-505241 | | 12/1997 |
| JP | 10-041244 | | 2/1998 |
| JP | 11-125841 | | 5/1999 |
| JP | 11-186163 | | 7/1999 |

OTHER PUBLICATIONS

Ishikawa, et al., "Excimer-Laser-Induced Lateral-Growth of Silicon Thin-Films", Jpn. J. Appl. Phys. Part 1, Mar. 1998, vol. 37, No. 3A pp. 731-736.
Eric R. Fossum, CMOS Image Sensors: Electronic Camera on a Chip, IEDM Digest, pp. 17-25, 1995, no month cited.
R.H. Nixon et al. 128×128 CMOS Photodiode-Type Active Pixel Sensor with On-Chip Timing, Control and Signal Chain Electronics, 1995, The International Society for Optical Engineering; Proceedings of the SPIE , vol. 2415, pp. 117-123, no month cited.
Japanese Office Action with translation dated Aug. 3, 2004 Japanese Application No. 2001-348273.

* cited by examiner

*Primary Examiner*—Jerome Jackson
*Assistant Examiner*—Paul Budd
(74) *Attorney, Agent, or Firm*—Katten Muchin Rosenman LLP

(57) ABSTRACT

In a thin film transistor (TFT) including an insulating substrate and a polycrystalline silicon island formed on the insulating layer, a grain size of the polycrystalline silicon island is elongated along one direction. A source region, a channel region and a drain region are arranged in the polycrystalline silicon island in parallel with the direction.

8 Claims, 20 Drawing Sheets

3(a-Si)

3(a-Si)   3'

3'

3'

3(a-Si)

METHOD FOR MANUFACTURING A THIN FILM TRANSISTOR HAVING HIGH MOBILITY AND HIGH ON-CURRENT

CROSS-REFERENCE TO RELATED APPLICATION

This application is a Divisional Application of application Ser. No. 09/988,962, filed on Nov. 19, 2001, abandoned.

BACKGROUND OF THE INVENTION

1. Field of the Invention

The present invention relates to a thin film transistor (TFT), a method for manufacturing the TFT, and apparatuses using the TFT.

2. Description of the Related Art

Generally, TFTs are manufactured on an insulating substrate by using a hydrogen-passivated amorphous silicon technology and a polycrystalline silicon technology.

According to the hydrogen-passivated amorphous silicon technology, since the maximum temperature during the manufacturing steps thereof is low, i.e., about 300° C., the mobility of carriers is low,i.e., about 1 $cm^2$/V·sec. Also, an insulating substrate can be a glass substrate having a low melting temperature, which would decrease the manufacturing cost.

However, in an active matrix-type liquid crystal display (LCD) apparatus manufactured by the hydrogen-passivated amorphous silicon technology, TFTs manufactured by the hydrogen-passivated amorphous silicon technology are used as the switching elements of pixels of a display panel of the LCD apparatus, and the TFTs are driven by a driver of an integrated circuit apparatus connected to a periphery of the display panel. As a result, since the display panel is connected to the driver for driving the display panel by a tape automated bonding (TAB) process or a wire bonding process, if the connection pitch between the display panel and the driver becomes small, it is actually impossible to connect the display panel to the driver.

On the other hand, according to the polycrystalline silicon technology, since the maximum temperature during the manufacturing steps thereof is high, i.e., about 1000° C., te mobility of carriers is about 30 to 100 $cm^2$/Vmsec. For example, a high temperature annealing process is required to convert amorphous silicon into polycrystalline silicom. Also, if TFTs manufactured by to polycrystalline silicon technology are used as the switching elements of pixels of a display panel of an active matrix-type LCD apparatus, a driver for driving the display panel can also be formed on the same substrate of the display panel, so that the above-mentioned TAB or wire bonding process is unnecessary.

In the polycrystalline silicon technology, since the maximum temperature is high as stated above, the insulating substrate has to be a fused quartz substrate having a high melting temperature, for example. This would increase the manufacturing cost.

In order to decrease the manufacturing cost, i.e., in order to decrease the temperature for converting amorphous silicon into polycrystalline silicon to adopt a glass substrate having a low melting temperature, a laser technology has been combined with the polycrystalline silicon technology.

In a prior art method for manufacturing a TFT by the polycrystalline silicon technology combined with the laser technology, first, a substrate covering layer made of silicon oxide is deposited on a glass substrate by a low pressure chemical vapor deposition (LPCVD) process or the like.

Next, an amorphous silicon (a-Si) layer is deposited on the substrate covering layer by an LPCVD process or the like. Next, the amorphous silicon layer is irradiated with a laser beam by moving the glass substrate along X-and Y-directions. This will be explained later in detail.

In the above-described prior art method, however, the laser beam has a rectangular size of several millimeters or several hundred micrometers. Additionally, the energy of the laser beam is relatively low, for example, 300 mJ/$cm^2$, and also, the slope of the energy with respect to the X- or Y-direction is relatively gentle. As a result, the amorphous silicon layer is converted into a polycrystalline silicon layer which has a randomly-small grain size. Thus, since the polycrystalline silicon layer forming a source region, a channel region and a drain region has a randomly-small grain size, the mobility of carriers is so low that the ON-current is low.

SUMMARY OF THE INVENTION

It is an object of the present invention to provide a TFT having a high mobility of carriers and a high ON-current and a method for manufacturing such a TFT.

Another object is to provide various kinds of apparatuses using such a TFT.

According to the present invention, in a TFT including an insulating substrate and a polycrystalline silicon island formed on the insulating layer, a grain size of the polycrystalline silicon island is elongated along one direction. A source region, a channel region and a drain region are arranged in the polycrystalline silicon island in parallel with the direction.

Also, in a method for manufacturing a TFT, an amorphous silicon layer is formed oh an insulating substrate. Then, the amorphous silicon layer is irradiated with a laser line beam along one direction, so that a portion of the amorphous silicon layer irradiated with the laser line beam is converted into a polycrystalline silicon layer. Then, the polycrystalline silicon layer is patterned into a polycrystalline silicon island. Then, a source region, a channel region and a drain region of the TFT are formed in the polycrystalline silicon island.

BRIEF DESCRIPTION OF THE DRAWINGS

The present invention will be more clearly understood from the description set forth below, as compared with the prior art, with reference to the accompanying drawings, wherein.

Figure 1:
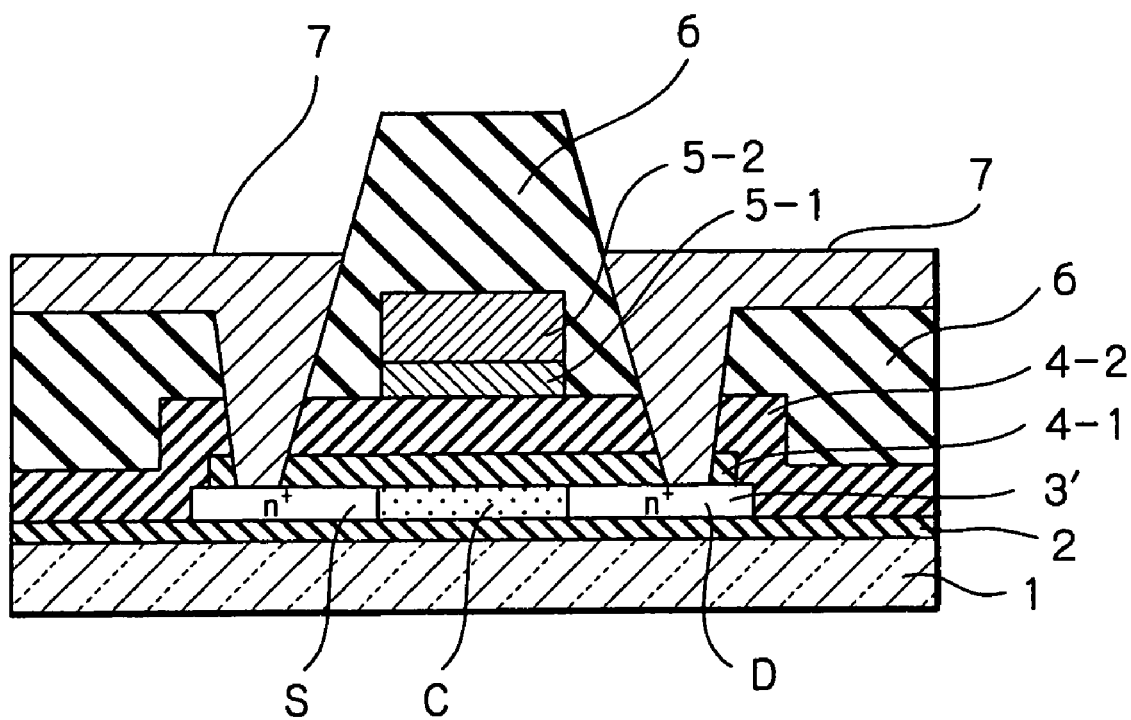
FIG. 1 is a cross-sectional views illustrating a prior art TFT.
Figure 2:
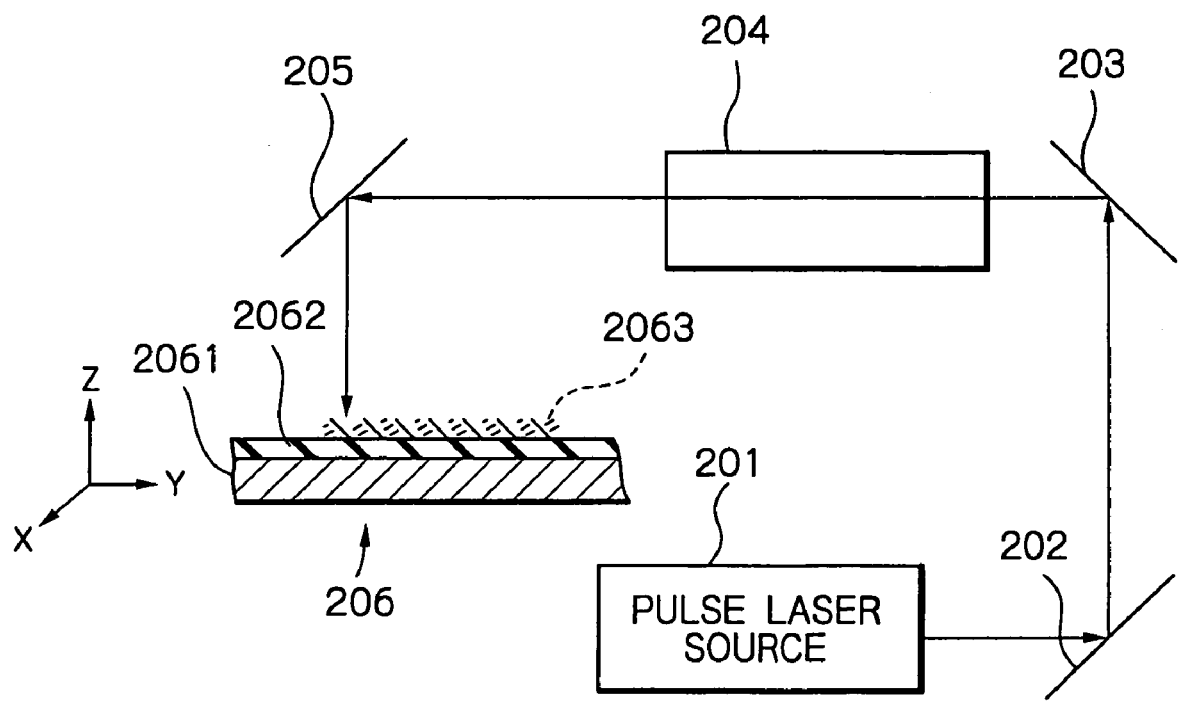
FIG. 2 is a diagram illustrating a pulse laser apparatus for manufacturing the polycrystalline silicon island of FIG. 1.

The polycrystalline silicon island 3' of FIG. 1 is formed by using a pulse laser irradiation apparatus as illustrated in FIG. 2.

Figure 17A:
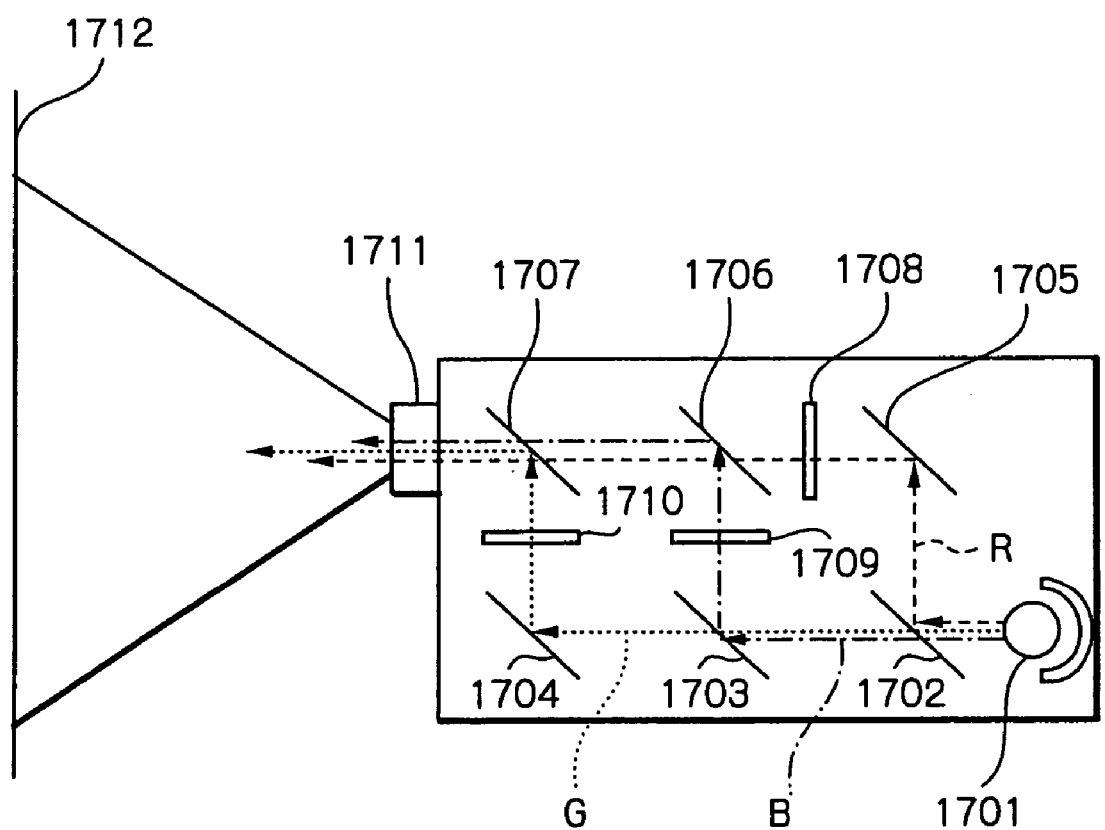
Figure 17B:
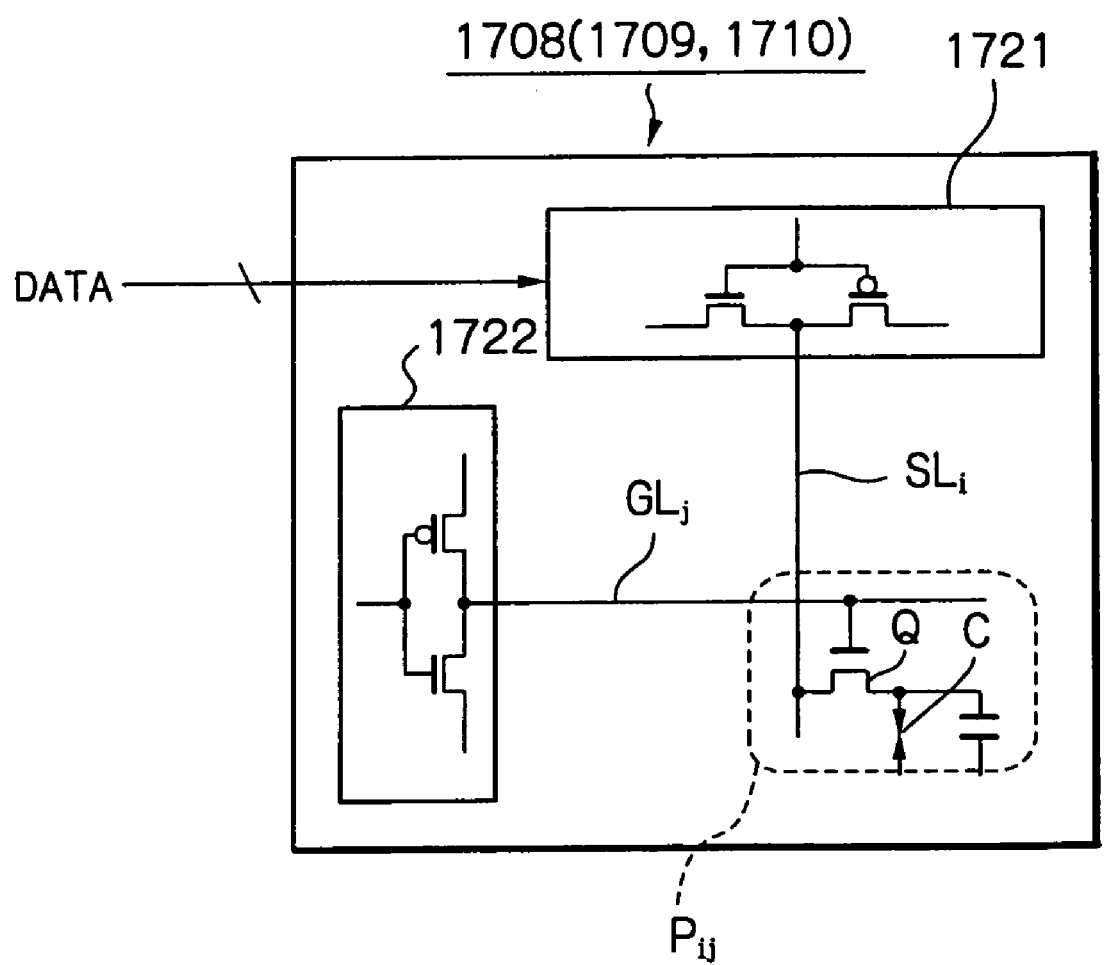

FIG. 17A is a diagram illustrating a projector to which the TFT according to the present invention is applied; and FIG. 17B is a circuit diagram of the light valve of FIG. 17A.

DESCRIPTION OF THE PREFERRED EMBODIMENT

Before the description of the preferred embodiment, a prior art method for manufacturing a TFT will be explained with reference to FIGS. 1, 2, 3A and 3B.

In FIG. 1, which illustrates a prior art TFT, reference numeral 1 designates a glass substrate on which a substrate covering layer 2 made of silicon oxide is formed. Also, a polycrystalline silicon island 3' including a source region S, a channel region C and a drain region D is formed on the substrate covering layer 2. The polycrystalline silicon island 3' is covered by gate insulating layers 4-1 and 4-2. Note that the gate insulating layers 4-1 and 4-2 can be formed by a single layer.

Additionally, patterned gate electrode layers 5-1 and 5-2 are formed on the gate insulating layers 4-1 and 4-2. The patterned gate electrode layers 5-1 and 5-2 are covered by a passivation layer 6. Note that the patterned gate electrode layers 5-1 and 5-2 can be formed by a single layer.

Further, contact holes are perforated in the gate insulating layers 4-1 and 4-2 and the passivation layer 6. A metal layer 7 is buried in the contact holes.

The polycrystalline silicon island 3' of FIG. 1 is formed by using a pulse layer irradiation apparatus as illustrated in FIG. 2.

In FIG. 2, laser beams emitted from a pulse laser source 201 passes through mirrors 202 and 203, a beam homogenizer 204 and a mirror 205 to reach a target 206. For example, the target 206 is formed by a glass substrate 2061, a substrate covering layer 2062 and an amorphous silicon layer 2063.

A prior art method for manufacturing the TFT of FIG. 1 will be explained next with reference to FIGS. 3A and 3B.

First, a substrate covering layer 2 made of silicon oxide is deposited on a glass substrate 1 by a low pressure chemical vapor deposition (LPCVD) process or the like.

Next, an amorphous silicon (a-Si) layer is deposited on the substrate covering layer 2 by an LPCVD process or the like.

Figure 3A:
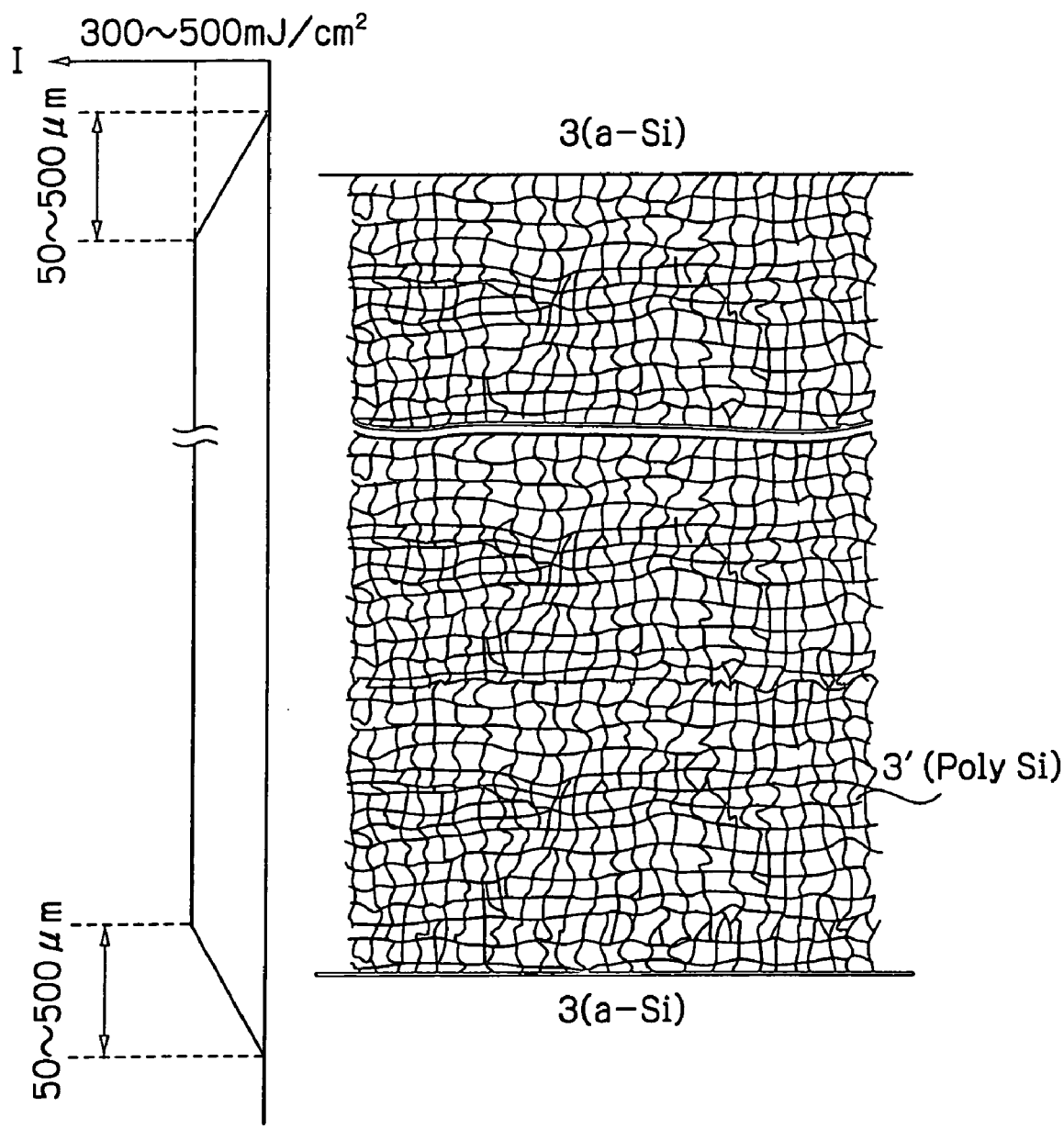
FIGS. 3A and 3B are plan views for explaining a prior art method for manufacturing the TFT of FIG. 1.

Next, referring to FIG. 3A, the amorphous silicon layer is irradiated with a laser beam emitted from the pulse laser apparatus of FIG. 2 by moving the glass substrate 1 along X- and Y-directions. In this case, the laser beam has a square size of several millimeters or several hundred micrometers. Additionally, the energy of the laser beam is relatively low, for example, about 300 to 500 mJ/cm$^2$, and also, the slope of the energy with respect to the X- or Y-direction is relatively gentle. As a result, a part of the amorphous silicon layer 3 is converted into a polycrystalline silicon layer 3' which has a randomly-small grain size as shown in FIG. 3A.

Figure 3B:
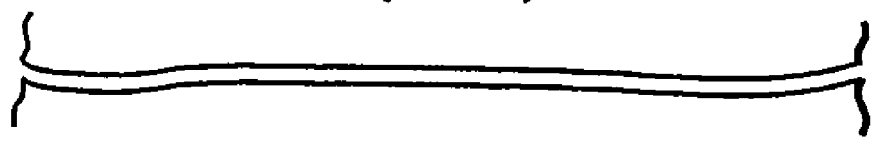
Figure 3B:
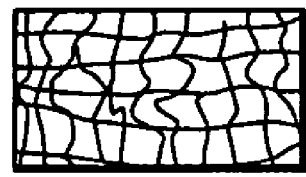
Figure 3B:
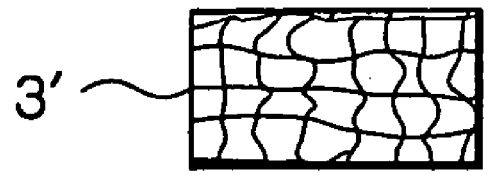
Figure 3B:

Next, referring to FIG. 3B, polycrystalline silicon islands 3' are formed by performing a photolithography and etching process upon the polycrystalline silicon layer 3'.

Next, referring to FIG. 3B, polycrystalline silicon islands 3' are formed by performing a photolithography and etching process upon the polycrystalline silicon layer.

Thereafter, gate insulating layers 4-1 and 4-2, patterned gate electrode layers 5-1 and 5-2, a passivation layer 6, and a metal layer 7 are formed to complete the TFT of FIG. 1.

In the manufacturing method as shown in FIGS. 3A and 3B, however, since the polycrystalline silicon island 3' has a randomly-small grain size, the mobility of carriers is so low that the ON-current is low.

An embodiment of the method for manufacturing a TFT according to the present invention will be explained next with reference to FIGS. 4A, 4B, 5A, 5B, 6A, 6B, 7A, 7B, 8A and 8B. Note that FIGS. 4A, 5A, 6A, 7A and 8A are cross-sectional views taken along the line A—A of FIGS. 4B, 5B, 6B, 7B and 8B, respectively.

Figure 4A:
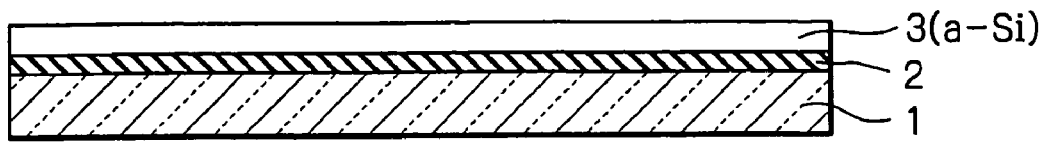
FIGS. 4A, 5A, 6A, 7A and 8A are cross-sectional views for explaining an embodiment of the method for manufacturing a TFT according to the present invention.
Figure 4B:
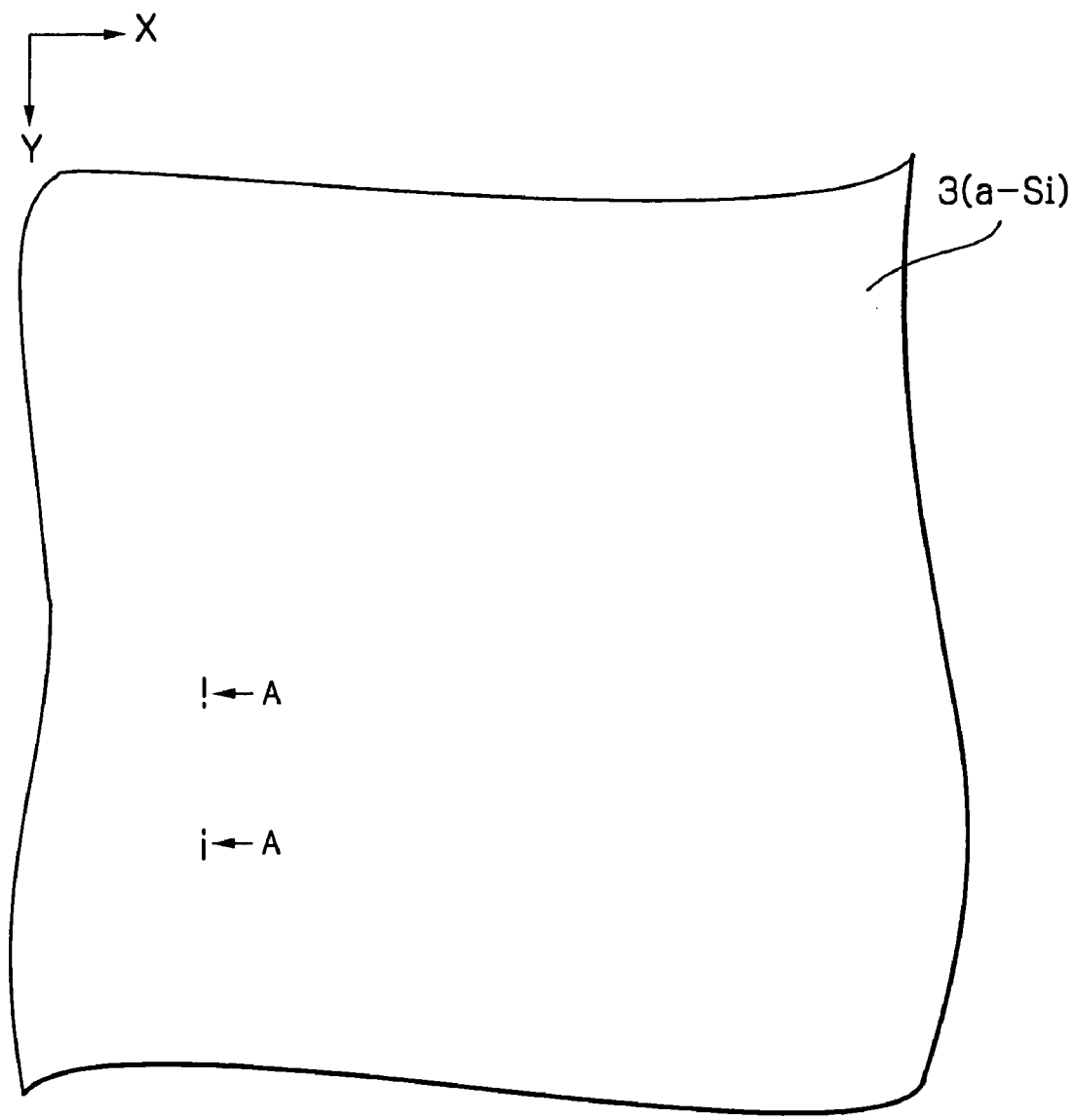
FIGS. 4B, 5B, 6B, 7B and 8B are plan views of the TFT of FIGS. 4A, 5A, 6A, 7A and 8A, respectively.

First, referring to FIGS. 4A and 4B, an about 0.5 to 1.1 mm thick glass substrate 1 is subject to a cleaning and rinsing process to remove contaminants such as organic matter, metal or small particles from the surface of the glass substrate 1. Then, in order to prevent harmful impurities from diffusing from the glass substrate 1, an about 1 82 m thick substrate covering layer 2 made of silicon oxide is deposited on the glass substrate 1 by an LPCVD process using silane gas and oxygen gas. Note that the substrate covering layer 2 can be deposited by a plasma CVD process using tetraethoxysilane (TEOS) gas and oxygen gas, an atmospheric pressure CVD (APCVD) process using TEOS gas and ozone gas, or a remote plasma CVD process where a deposition area is separated from a plasma gas generation area. Then, an about 60 to 80 nm thick amorphous silicon layer 3 is deposited on the substrate covering layer 2 by an LPCVD process using disilane gas at a temperature of about 500° C. In this case, the hydrogen concentration of the amorphous silicon layer 3 is less than 1 atom percent to prevent the emission of hydrogen atoms from the amorphous silicon layer 3 by a laser irradiation process which will be carried out later. If a large number of hydrogen atoms are emitted from the amorphous silicon layer 3, the surface of a polycrystalline silicon layer converted therefrom greatly fluctuates. Also, the above-mentioned amorphous silicon layer 3 having a low hydrogen concentration can be deposited by a plasma CVD process using silane gas and hydrogen gas, or tetrafluoro-silane gas and hydrogen gas.

Figure 5A:
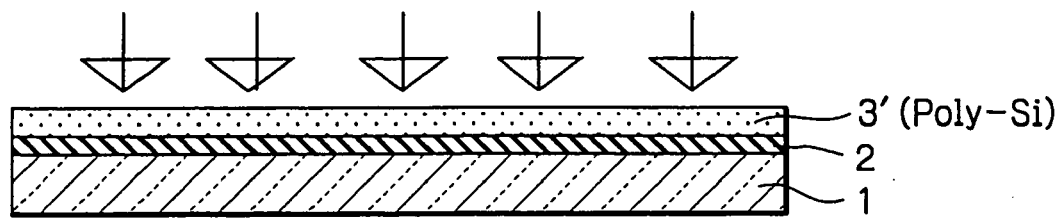
Figure 5B:
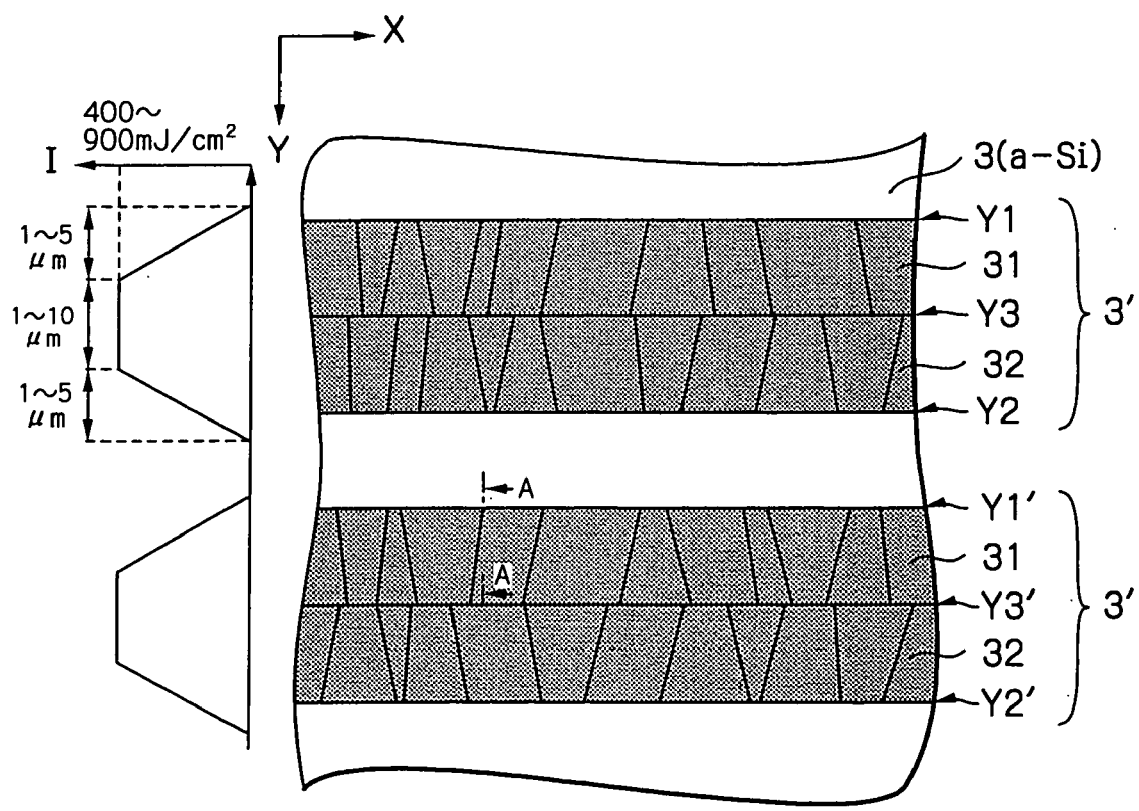

Next, referring to FIGS. 5A and 5B, the glass substrate 1 is again subject to a cleaning and rinsing process to remove contaminants such as organic matter, metal, small particles and silicon oxide from the surface of the amorphous silicon layer 3. Then, the glass substrate 1 is entered into the pulse laser apparatus of FIG. 2 where the amorphous silicon layer 3 is irradiated with laser line beams under an atmosphere of pure nitrogen gas at a 700 Torr (8.33 ×10$^4$ Pa). In this case, the laser line beams have a rectangular size of 5 μm ×100 μm. Also, the energy of the laser beams is relatively high, for example, about 400 to 900 mJ/cm$^2$, and also, the slope of the energy with respect to the Y-direction is relatively sharp. As a result, as illustrated in FIG. 5B, crystalline silicon seeds (not shown) are randomly generated at portions of the amorphous silicon layer 3 at Y=Y1, Y2, Y1' and Y2' where the temperature is close to a melting point of silicon. Then, polycrystalline silicon is grown from the crystalline silicon seeds toward the center of each of the laser line beams at Y=Y3 and Y3'. Finally, the growth of polycrystalline silicon stops at Y=Y3 and Y3'. Thus, a polycrystalline silicon layer 3' is obtained to include elongated grains having a length of an approximately half of the width of the laser line beams. As a result, the polycrystalline silicon layer 3' has stripes each of which is divided into two regions 31 and 32. Then, nitrogen is exhausted from the pulse laser apparatus, and then, oxygen gas is introduced thereinto.

Figure 6A:
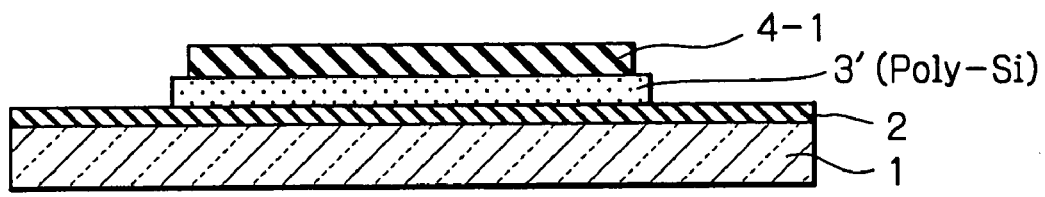
Figure 6B:
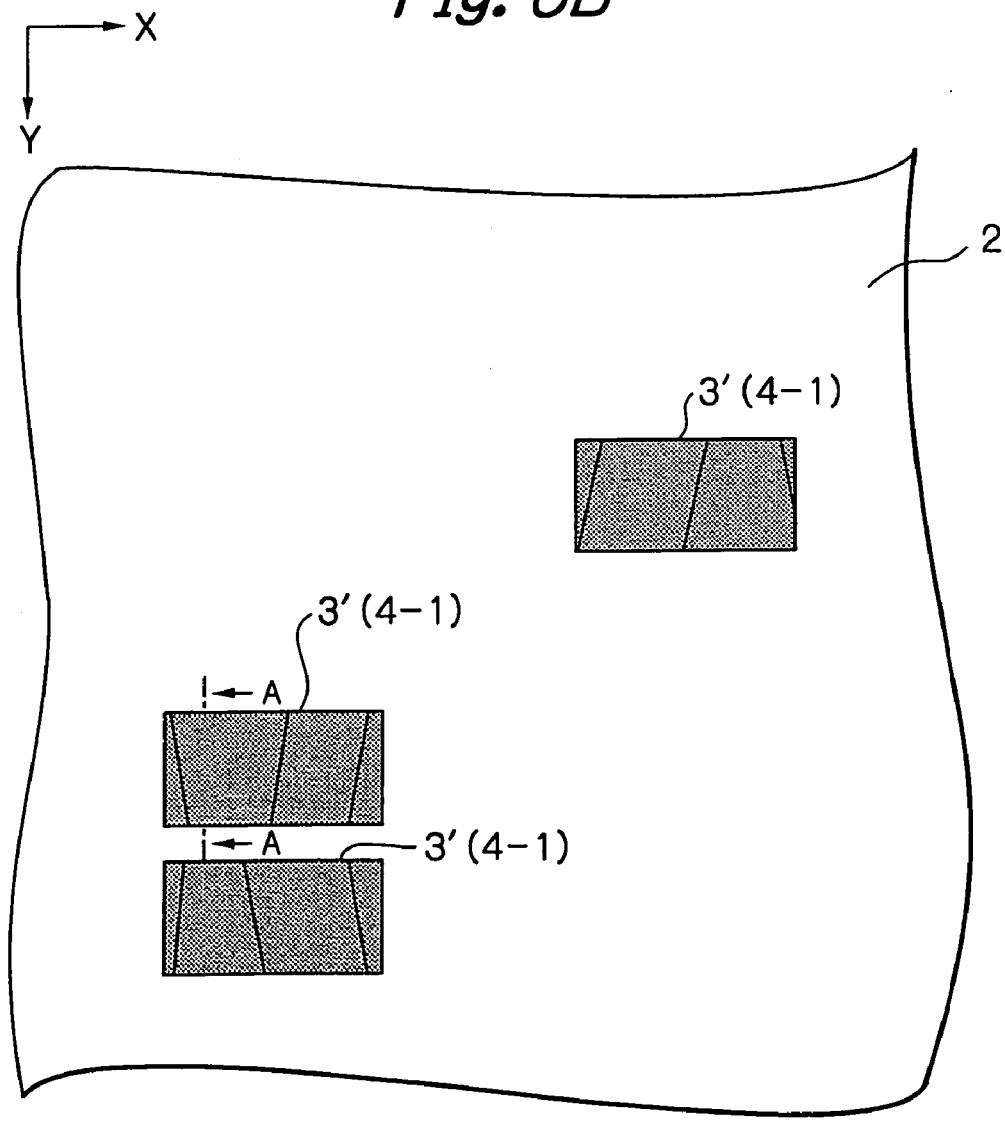

Next, referring to FIGS. 6A and 6B, an about 10 nm thick gate insulating layer 4-1 made of silicon oxide is deposited on the entire surface by a plasma CVD process using silane gas, helium gas and oxygen gas at a temperature of about 350° C. Note that the gate insulating layer 4-1 can be deposited by a plasma CVD process using TEOS gas and oxygen gas or an APCVD process using TEOS gas and ozone gas. Thereafter, as occasion demands, a hydrogen plasma process and an annealing process are carried out. Then, the gate insulating layer 4-1 and the polycrystalline silicon layer 3' are patterned by a photolithography and etching process, so that islands formed by the gate insulating layer 4-1 and the polycrystalline silicon layer 3' are formed. In this case, the sides of the islands (3', 4-1) are tapered to suppress gate leakage currents. However, the gate insulating layer 4-1 can be deleted.

Figure 7A:
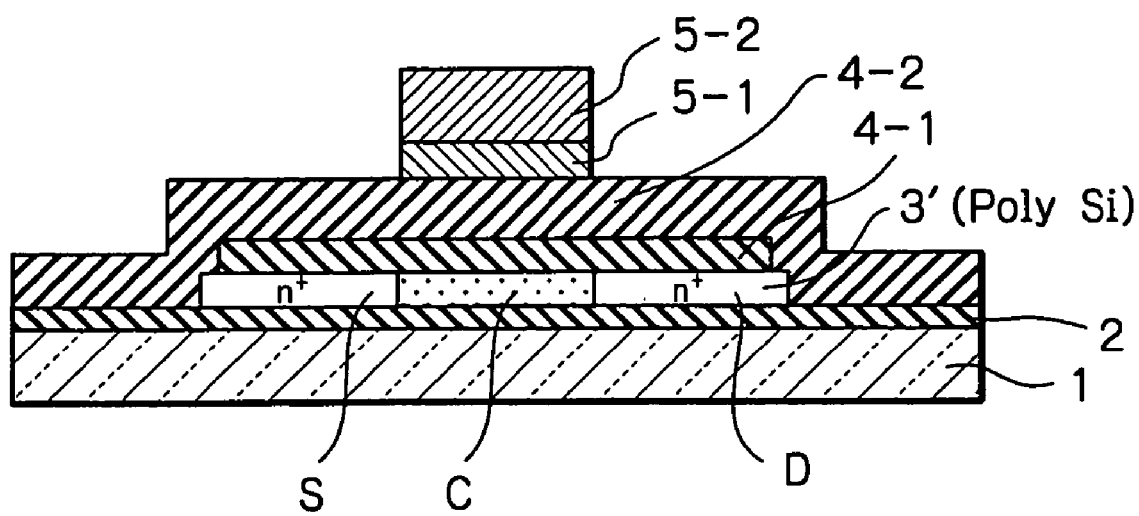
Figure 7B:
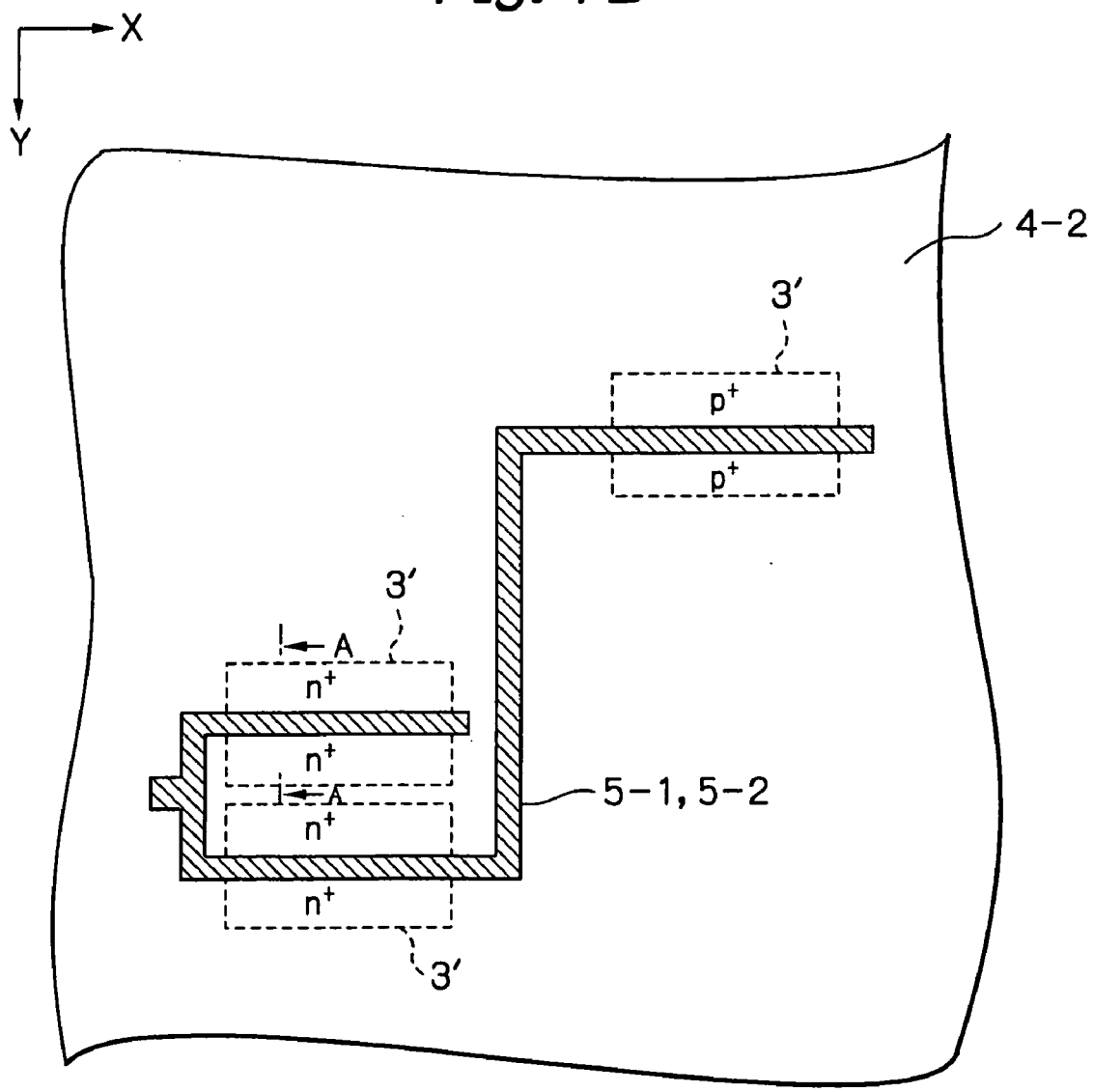

Next, referring to FIGS. 7A and 7B, the glass substrate 1 is again subject to a cleaning and rinsing process to remove contaminants such as organic matter, metal and small particles from the surface of the gate insulating layer 4-1 and the like. Then, an about 30 nm thick gate insulating layer 4-2 made of silicon oxide is deposited on the entire surface by a plasma CVD process using silane gas and oxygen gas at a temperature of about 450° C. Note that the gate insulating layer 4-2 can be deposited by a plasma CVD process using TEOS gas and oxygen gas or an APCVD process using TEOS gas and ozone gas. Then, an about 80 nm thick gate electrode layer 5-1 made of phosphorus-doped polycrystalline silicon is deposited on the gate insulating layer 4-2 by a plasma CVD process or an LPCVD process, and an about 110 nm thick gate electrode layer 5-2 made of tungsten silicide is deposited on the gate electrode layer 5-1 by a sputtering process. Then, the gate electrode layers 5-1 and 5-2 are patterned by a photolithography and etching process. Then, impurity ions are implanted into the polycrystalline silicon islands 3' in self-alignment with the patterned gate electrode layers 5-1 and 5-2. For example, if the impurity ions are of an n-type, source regions S and drain regions D of an $n^+$-type are formed within the polycrystalline silicon islands 3'. On the other hand, if the impurity ions are of a p-type, source regions S and drain regions D of a $p^+$-type are formed within the polycrystalline silicon islands 3'. Note that undoped regions of the polycrystalline silicon islands 3' serve as channel regions C.

Figure 8A:
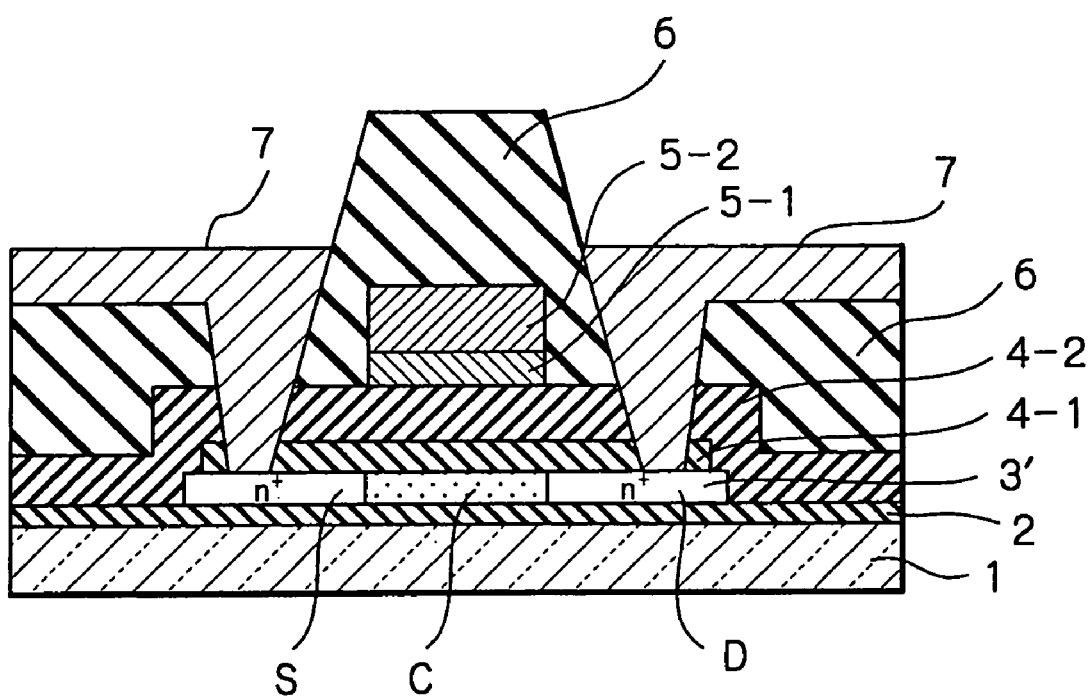
Figure 8B:
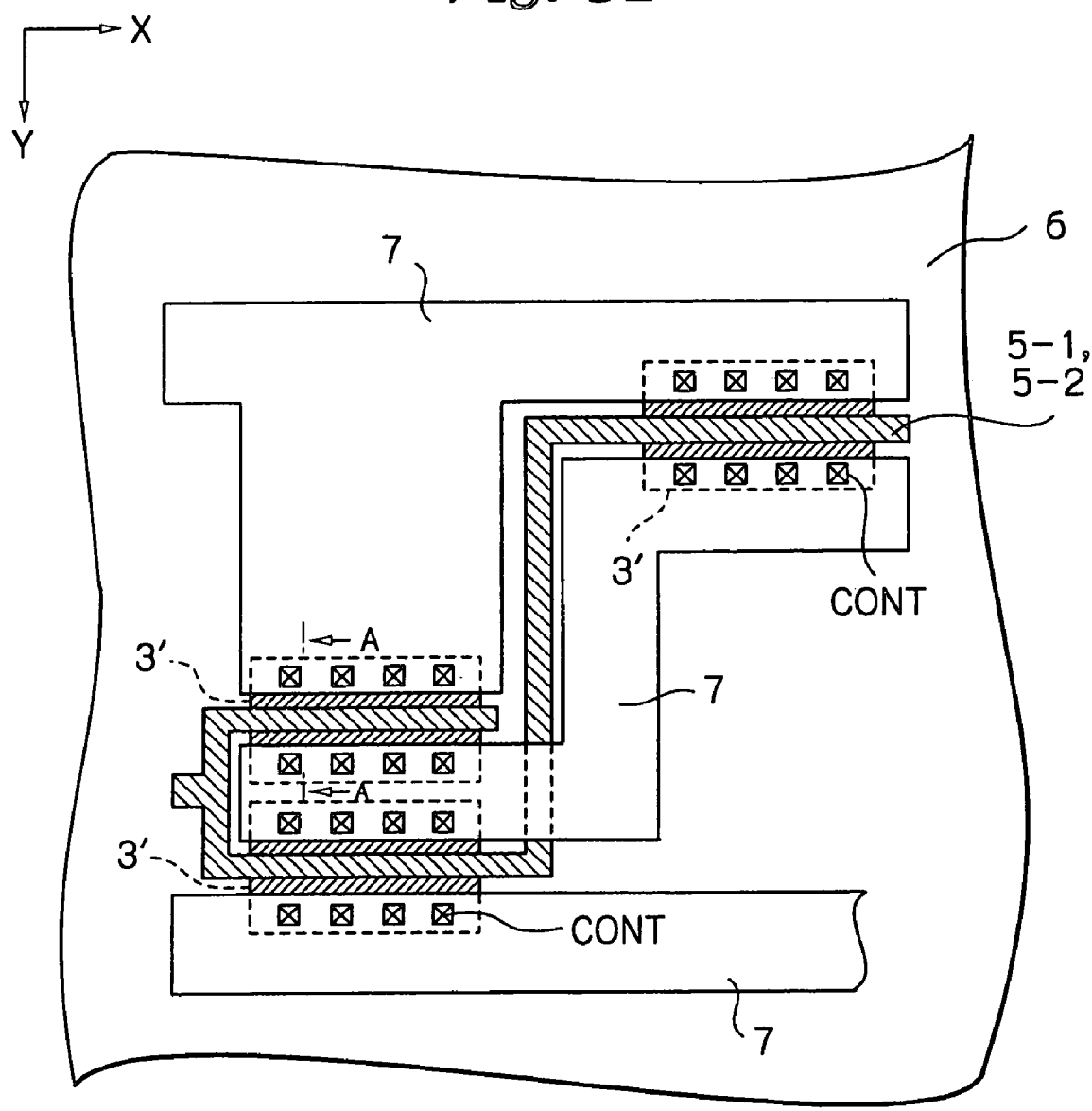

Finally, referring to FIGS. 8A and 8B, a passivation layer 6 made of silicon oxide is deposited on the entire surface by a plasma CVD process using TEOS gas and oxygen gas or an APCVD process using TEOS gas and ozone gas. Note that, the passivation layer 6 can be made of silica coating material, organic coating material, or silicon nitride. As occasion demands, the passivation layer 6 is flattened by an annealing process or the like. Then, contact holes CONT are perforated in the gate insulating layers 4-1 and 4-2 and the passivation layer 6 by a photolithography and etching process thereupon. Then, a metal layer 7 made of aluminum, aluminum alloy, copper, copper alloy or refractory metal such as tungsten or molybdenum is deposited on the entire surface by a sputtering process or the like, and the metal layer 7 is patterned by a photolithography and etching process.

In FIG. 8B, note that a CMOS inverter formed by a P-channel TFT and two N-channel TFTs.

Figure 9:
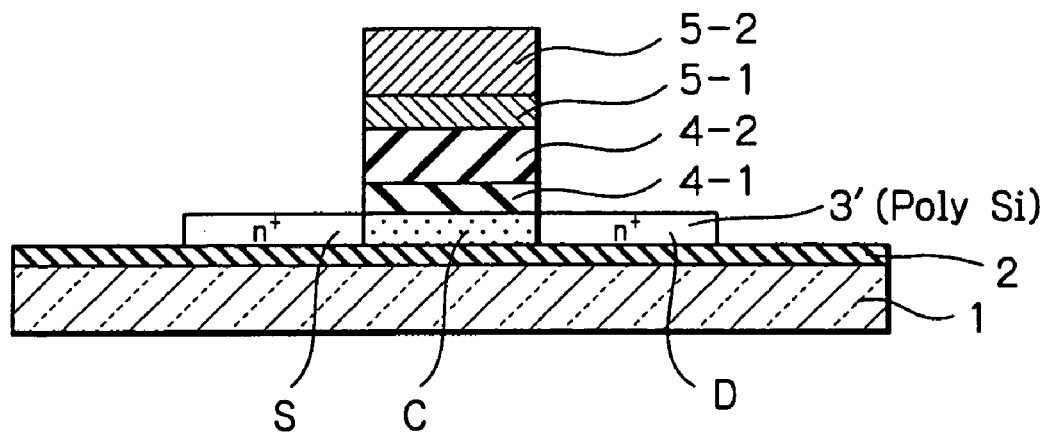
FIGS. 9 and 10 are cross-sectional views illustrating modifications of FIGS. 7A and 8A, respectively.
Figure 10:
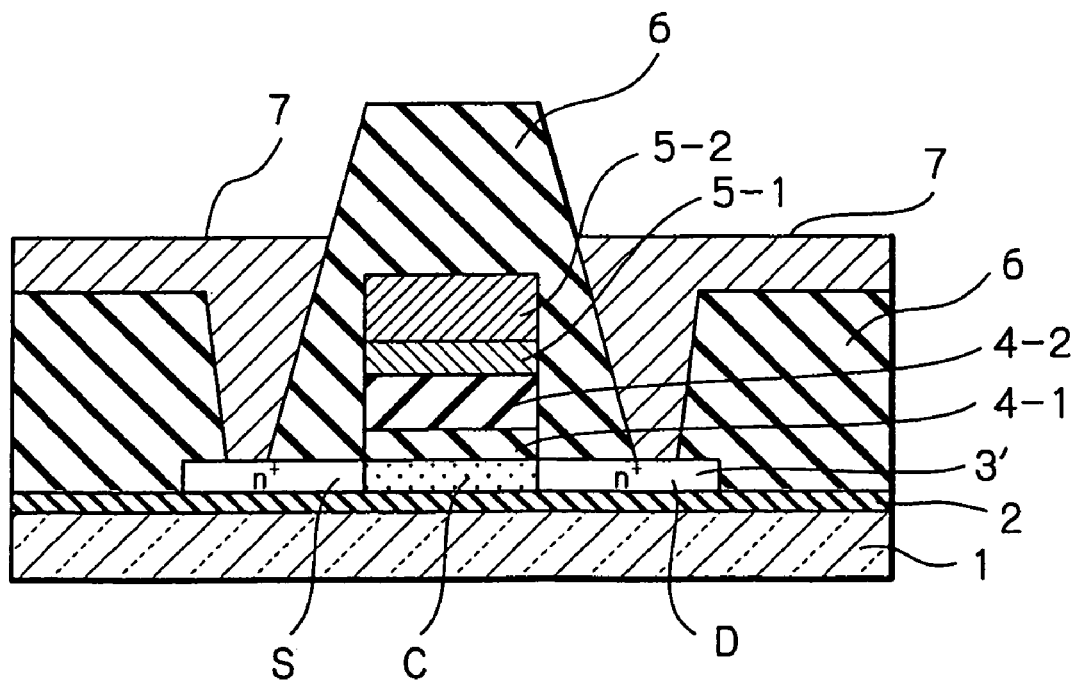

In FIGS. 9 and 10, which are cross-sectional views of modifications of FIGS. 7A and 8A, respectively, the implantation of impurity ions is performed directly upon the polycrystalline silicon islands 3'. In this case, the gate insulating layers 4-1 and 4-2 are etched by using the gate electrode layers 5-1 and 5-2 as an etching mask before the implantation of impurity ions.

In the above-described embodiment, the irradiation of laser line beams to the amorphous silicon layer 3 can be carried out by using alignment marks. For example, the alignment marks made of tungsten silicide or the like are formed on the substrate covering layer 2 before the irradiation of laser beams to the amorphous silicon layer 3. On the other hand, alignment marks are formed on the amorphous silicon layer 3 simultaneously with the irradiation of laser line beams to the amorphous silicon layer 3. Thereafter, the patterning of the polycrystalline silicon layer 3' into the islands is carried out by using the above-mentioned alignment marks.

Figure 11A:
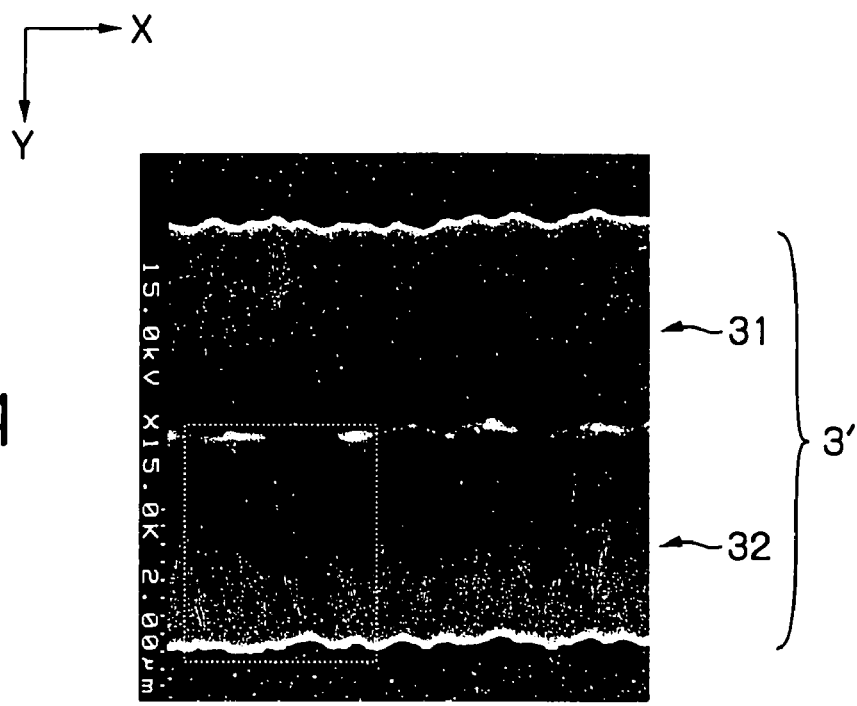
FIGS. 11A and 11B are scanning electron microscope (SEM) photographs showing the polycrystalline silicon layer of FIGS. 5A and 5B.
Figure 11B:
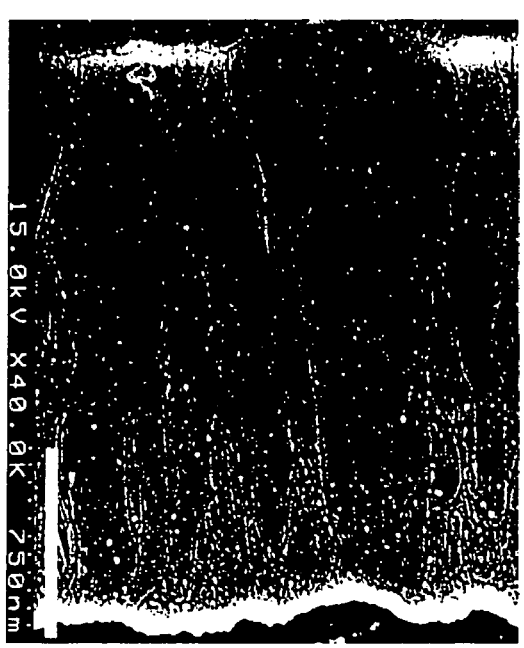

The inventors have actually obtained the polycrystalline silicon layer 3' of FIGS. 5A and 5B as shown in SEM photographs as shown in FIGS. 11A and 11B. Note that FIG. 11B is an enlargement of FIG. 11A. Apparently, the polycrystalline silicon layer 3' has elongated grains along the Y direction and is divided into the two regions 31 and 32.

In the above-described embodiments, since the TFTs are formed so that the running direction of carriers is along the Y direction, i.e., the growth direction of crystal, the mobility of carriers is so high that the ON current is high. Additionally, since each of the TFTs are formed within either of the regions 31 and 32, the mobility of carriers is further increased, so that the ON current is further increased. Note that if each of the TFTs is formed across the regions 31 and 32, the mobility of carriers is a little decreased so that the ON current is a little decreased.

Apparatuses to which the TFT of the present invention is applied will be explained next with reference to FIGS. 12, 13, 14, 15, 16, 17A and 17B.

A first example is a digital camera as illustrated in FIGS. 12, 13, 14 and 15.

Figure 12:
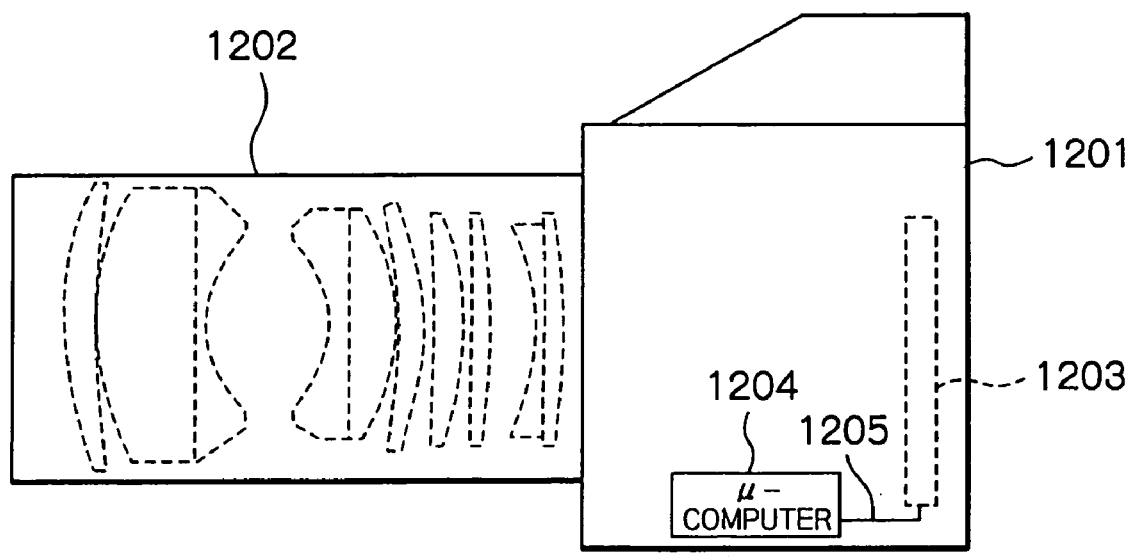
FIG. 12 is a diagram illustrating a digital camera to which the TFT according to the present invention is applied.

In FIG. 12, a digital camera is constructed by a camera body 1201 on which a lens 1202 is mounted. An image input unit 1203 is incorporated into the camera body 1201. For example, the image input unit 1203 has the same size as the size of a 35-mm photographic film. Therefore, in the digital camera of FIG. 12, the image input unit 1203 can be replaced with 35-mm photographic films. Also, a microcomputer 1204 formed by a central processing unit (CPU), a flash memory, an encoder, an interface and the like is incorporated into the camera body 1201, and can be connected by a flexible cable 1205 to the image input unit 1203.

Figure 13:
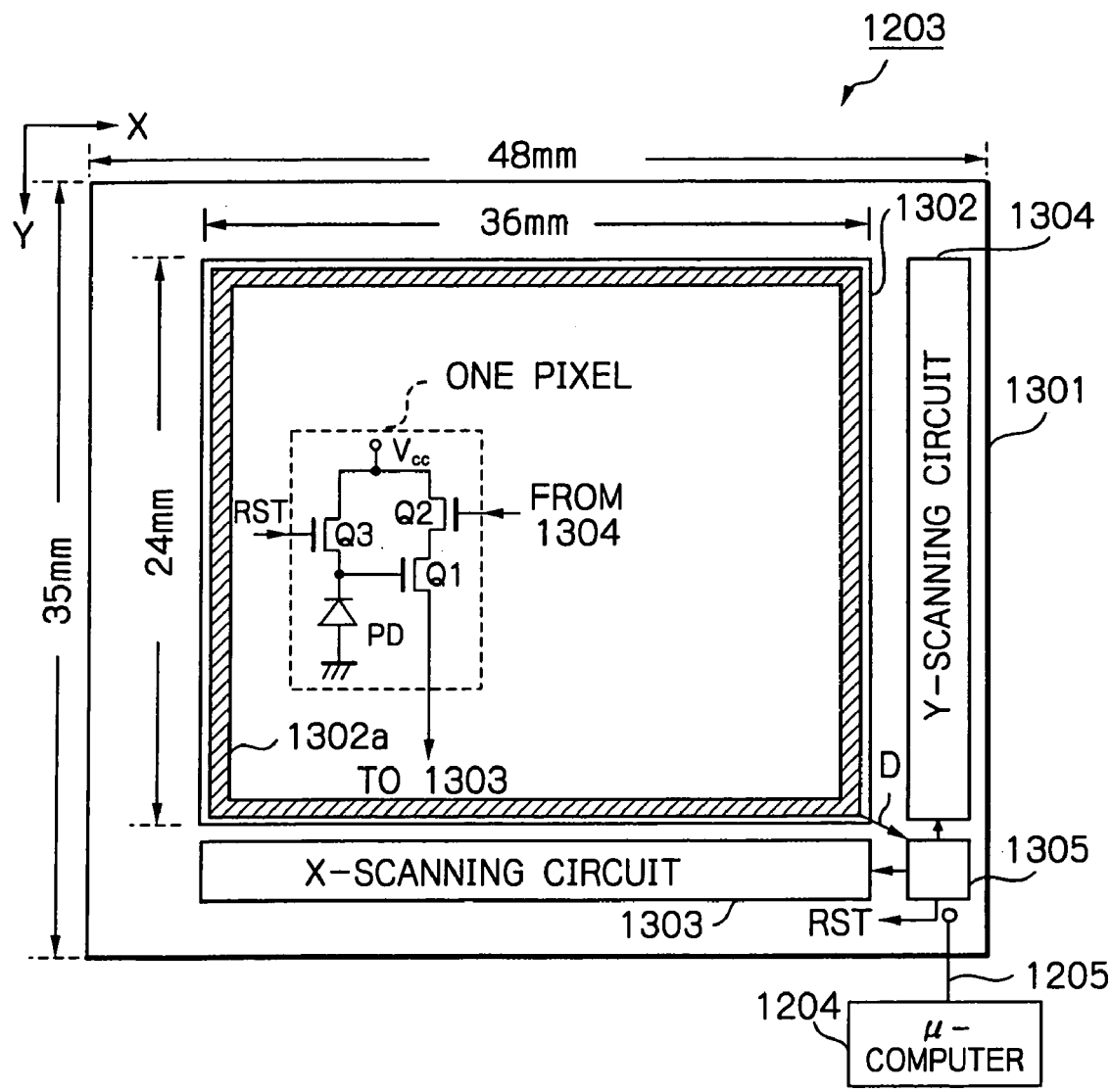
FIG. 13 is a detailed plan view of the image input unit of FIG. 12.
Figure 14:
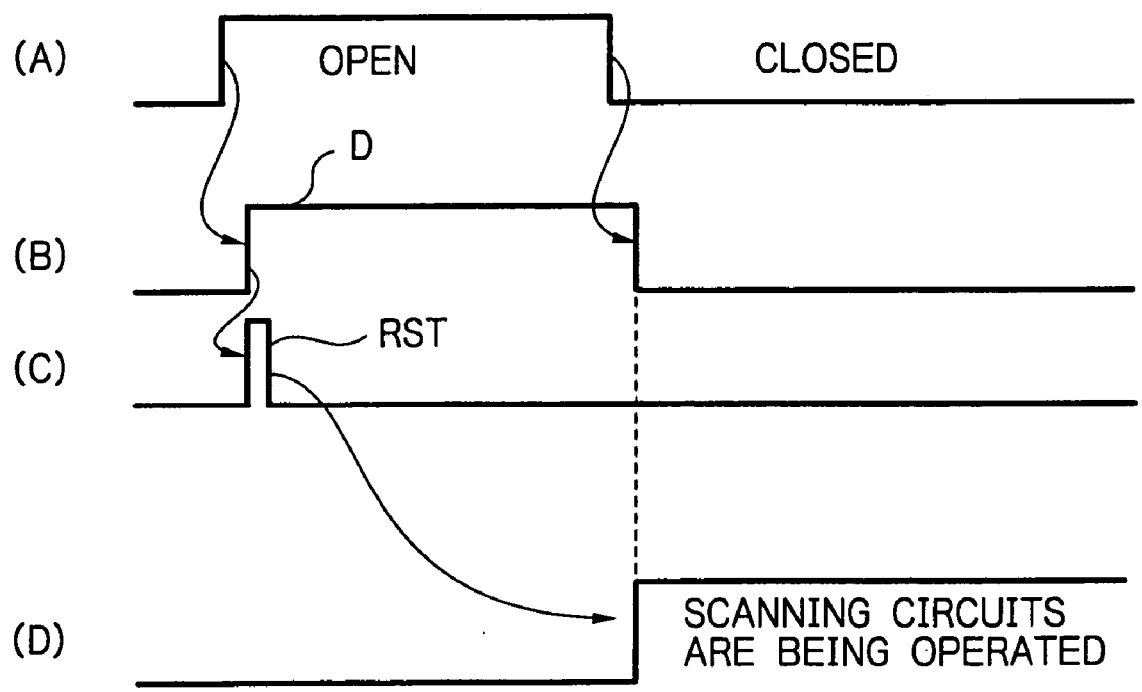
FIG. 14 is a timing diagram for showing the operation of the image input unit of FIG. 13.

In FIG. 13, which is a detailed plan view of the image input unit 1203 of FIG. 12, the image input unit 1203 is constructed by a glass substrate 1301 corresponding to the glass substrate 1 of the embodiment of the TFT according to the present invention, a pixel array section 1302, and peripheral circuits such as an X-scanning circuit 1303, a Y-scanning circuit 1304 and a reset circuit 1305. In this case, the glass substrate 1301 is 1.1 mm, 0.7 mm or 0.5 mm thick, and has a size of 48 mm×35 mm. Also, the pixel array section 1302 has a size of 36 mm×24 mm.

The pixel array section 1302 is constructed by a plurality of photodiode-type active pixels each including a 20 μm×20 μm photodiode PD such as a Schottky barrier diode buffered by a source follower TFT Q1, a selection TFT Q2 and a reset TFT Q3. The TFT Q1 is selected by the X-scanning circuit 1303, while the TFT Q2 is selected by the Y-scanning circuit 1304. Also, the TFT Q3 is turned ON by a reset signal RST of the reset circuit 1305, thereby resetting the voltage of the photodiodePD at $V_{cc}$, (see: Eric R. Fossum, FIG. 4 of "CMOS Image Sensor: Electronic Camera On A Chip", IEDM Digest, pp. 17–25, 1995). Note that a PIN diode can be used as the photodiode PD. The TFTs Q1, Q2 and Q3 are those according to the embodiment of the present invention.

Also, a photodiode 1302a such as a Schottky barrier diode is provided at a periphery area of the pixels to detect whether or not a shutter (not shown) in the camera body 1201 is opened. That is, as shown in FIG. 14(A), when the shutter is opened, the photodiode 1302a generates a detection signal D as shown in FIG. 14(B). As a result, the reset circuit 1305 receives the detection signal D and generates a reset signal RST as shown in FIG. 14(C) in response to a rising edge of the detection signal D. Therefore, the TFTs Q3 of all the pixels are turned ON, so that the voltage of the photodiode PD are reset at $V_{cc}$. Then, when a predetermined time period has passed after the reset signal RST is generated, the scanning circuits 1303 and 1304 are operated as shown in FIG. 14(D) so that image information stored in the photodiodes PD of all the pixels are transmitted to the microcomputer 1204 which performs data processing thereupon. Note that a PIN diode can be used as the photodiode 1302a.

Figure 15:
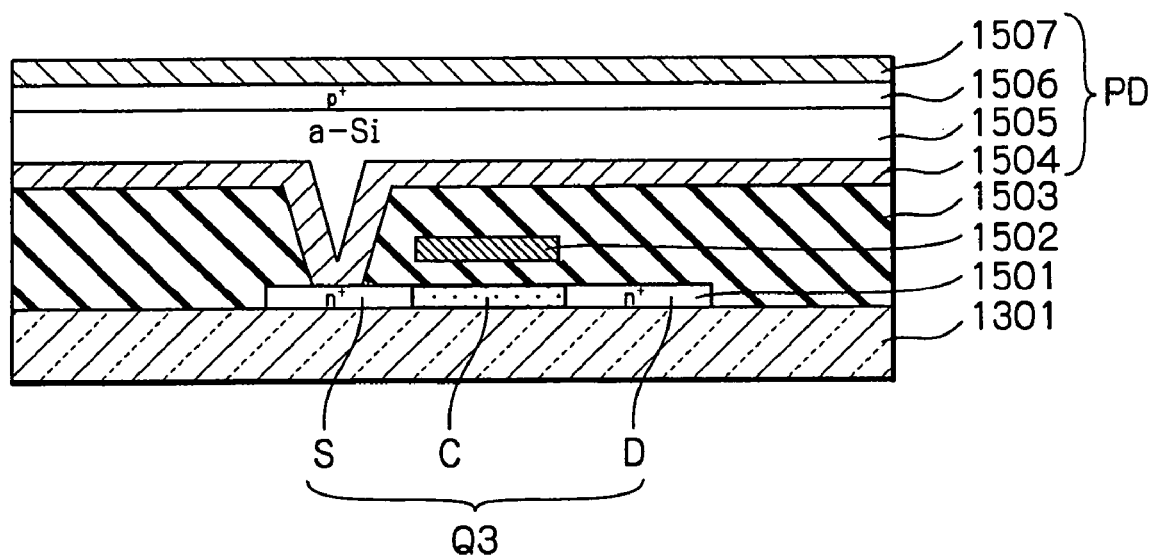
FIG. 15 is a cross-sectional view of the photodiode and the reset TFT of FIG. 13.

In FIG. 15, which is a detailed cross-sectional view of the photodiode PD and the TFT Q3 of FIG. 13, the TFT Q3 is formed on the glass substrate 1301 in accordance with the embodiment of the present invention. That is, the TFT Q3 is constructed by a polycrystalline silicon island 1501, a source region S, a channel region C and a drain region D corresponding to the polycrystalline silicon island 3' of FIG. 8A or 10, a gate electrode 1502 corresponding to the gate electrode layers 5-1 and 5-2 of FIG. 8A or 10, and an insulating layer 1503 corresponding to the gate insulating layers 4-1 and 4-2 and the passivation layer 6 of FIG. 8A or 10. Also, a contact hole is perforated in the insulating layer 1503 above the source region S of the polycrystalline silicon island 1501. Further, a Cr lower electrode layer 1504, an intrinsic amorphous silicon layer 1505, a P$^+$-type amorphous silicon layer 1506 and an upper indium tin oxide (ITO) upper transparent electrode layer 1507 are sequentially formed to form the photodiode PD. Note that, if the photodiode PD is replaced by a PIN diode, an n-type amorphous silicon layer is inserted between the Cr under electrode layer 1504 and the intrinsic amorphous silicon layer 1505.

In FIG. 15, only the TFT Q3 is illustrated, however, the TFTs Q1 and Q2 are also formed in the same way as the TFT Q1, so that the photodiode PD is formed over the TFTs Q1, Q2 and Q3.

Figure 16:
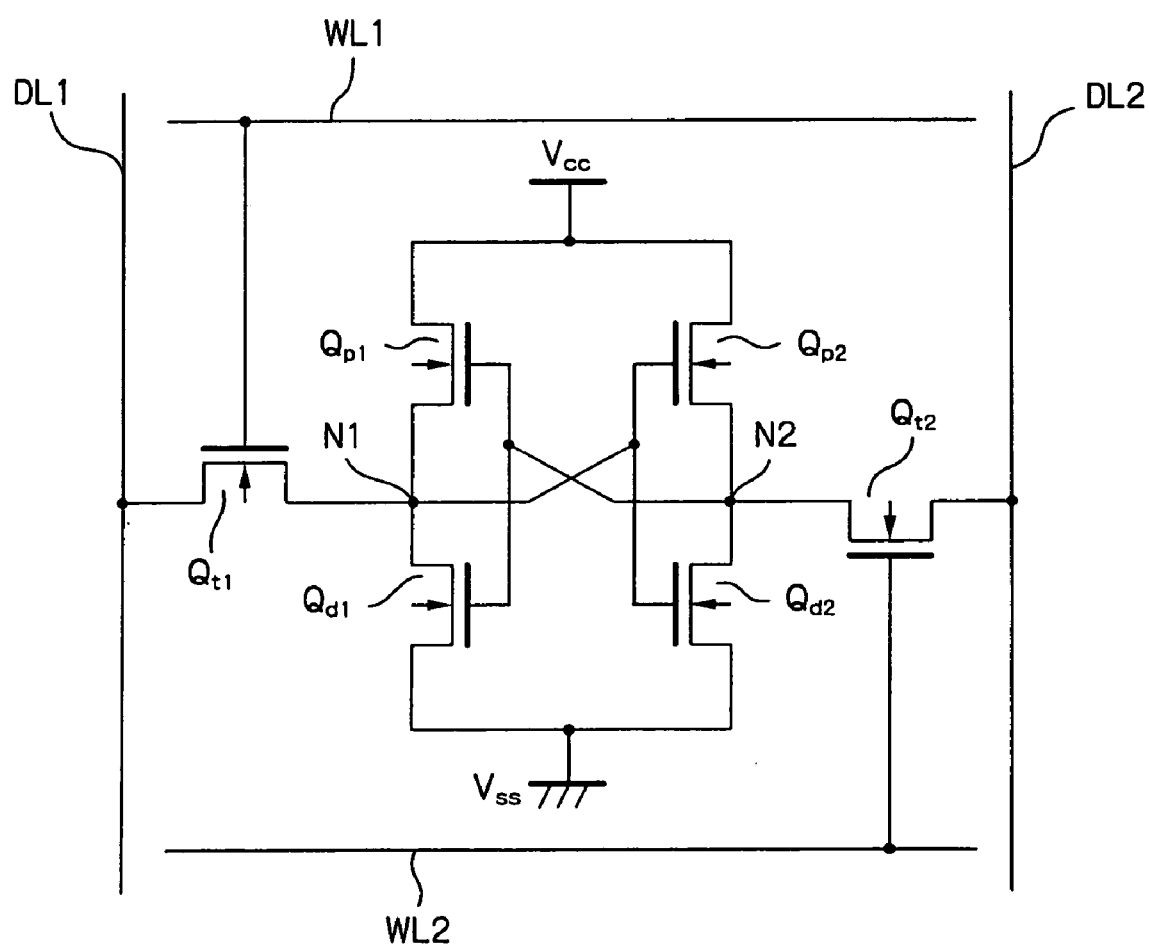
FIG. 16 is a circuit diagram illustrating a static random access memory (SRAM) cell to which the TFT according to the present invention is applied.

A second example is an SRAM cell as illustrated in FIG. 16. In FIG. 16, one memory cell is provided at each intersection between two word lines WL1 and WL2 and two complementary date lines DL1 and DL2. Thus memory cell is constructed by a flip-flop formed by two cross-coupled inverters, and two N-channel transfer MOS transistors $Q_{t1}$ and $Q_{t2}$ connected between the flip-flop and the data lines DL1 and DL2. The transfer transistors $Q_{t1}$ and $Q_{t2}$ are controlled by voltages at the word lines WL1 and WL2, respectively. Each of the inverters includes a P-channel load TFT $Q_{p1}$ ($Q_{p2}$) and an N-channel driving bulk MOS transistor $Q_{d1}$ ($Q_{d2}$) between a power supply voltage line $V_{cc}$ and a ground voltage line $V_{ss}$.

The P-channel TFTs $Q_{p1}$ and $Q_{p2}$ are those according to the present invention.

A third example is a projector as illustrated in FIGS. 17A and 17B.

In FIG. 17A, the projector is constructed by a halogen lamp 1701, diachroic lenses 1702 to 1707, light valves 1708, 1709 and 1710, a projection lens 1711 and a screen 1712. In this case, a red component R is generated by the lenses 1702, 1705, 1706 and 1707 and the light valve 1708; a blue component B is generated by the lenses 1702, 1703, 1706 and 1707 and the light valve 1709; and a green component G is generated by the lenses 1702, 1703, 1704 and 1707 and the light valve 1710.

As illustrated in FIG. 17B, each of the light valves 1708, 1709 and 1710 is an active matrix-type liquid crystal display (LCD) apparatus which is constructed by a plurality of pixels $P_{ij}$ at intersections between data bus lines $DL_i$ and gate bus lines $GL_j$. One of the data bus lines $SL_i$ is driven by a data driver 1721 and one of the gate bus lines $GL_j$ is driven by a gate driver 1722. Also, each of the pixels $P_{ij}$ is constructed by one TFT Q and one liquid crystal cell C. The TFT Q is one according to the embodiment of the present invention.

As explained hereinabove according to the present invention, in a TFT, the mobility of carriers can be increased, and accordingly, the ON current can be increased.

The invention claimed is:

1. A method for manufacturing a thin film transistor, comprising the steps of:
    forming an amorphous silicon layer on an insulating substrate;
    irradiating said amorphous silicon layer with a laser line beam along a first direction, so that a portion of said amorphous silicon layer irradiate with said laser line beam is converted into a polycrystalline silicon layer;
    patterning said polycrystalline silicon layer into a polycrystalline silicon island; and
    forming a source region, a channel region and a drain region of said thin film transistor in said polycrystalline silicon island;
    wherein said laser line beam irradiating step irradiates said amorphous silicon layer with said laser line beam, so that polycrystalline silicon is grown from portions of said amorphous silicon layer close to edges of said laser line beam to a portion of said amorphous silicon layer close to a center of said laser line beam, said polycrystalline silicon layer being divided into two regions at a line corresponding to the center of said laser line beam;
    wherein said polycrystalline silicon island is located within either of the two regions of said polycrystalline silicon layer.

2. A method for manufacturing a thin film transistor, comprising the steps of: forming an amorphous silicon layer on an insulating substrate; irradiating said amorphous silicon layer with a laser line beam along a first direction, so that polycrystalline silicon is grown from portions of said amorphous silicon layer close to edges of said laser line beam to a portion of said amorphous silicon layer close to a center of said laser line beam, thus forming a polycrystalline silicon layer divided into two regions at a line corresponding to the center of said laser line beam; patterning said polycrystalline silicon layer into a polycrystalline silicon island; and forming a source region, a channel region and a drain region of thin film transistor in either of the two regions of said polycrystalline silicon island along a second direction perpendicular to said first direction.

3. The method as set forth in claim 2, wherein said insulating substrate comprises a glass substrate.

4. A method for manufacturing a P-channel type thin film transistor and an N-channel type thin film transistor, comprising the steps of:
- forming an amorohous silicon layer on an insulating substrate;
- irradiating said amorohous silicon layer with a plurality of laser line beams alone first direction, so that portions of said amorphous silicon layer irradiated with said laser line beams are converted into a plurality of polycrystalline silicon layers;
- patterning each of said polycrystalline silicon layers into a plurality of polycrystalline silicon islands; and forming a source region, a channel region and a drain region of said P-channel type thin film transistor in one of said polycrystalline silicon islands of one of said polycrystalline silicon layers and a source region, a channel region and a drain region of said N-channel thin film transistor in one of said polycrystalline silicon islands of the other of said polycrystalline silicon layers;
- wherein said source region, said channel region and said drain region of said P-channel type thin film transistor said source region, said channel region and said drain region of said N-channel thin film transistor are arranged along a second direction perpendicular to said first direction.

5. A method for manufacturing a P-channel type thin film transistor and an N-channel type thin film transistor, comprising the steps of:
- forming an amorohous silicon layer on an insulating substrate;
- irradiating said amorohous silicon layer with a plurality of laser line beams alone first direction, so that portions of said amorphous silicon layer irradiated with said laser line beams re converted into a plurality of polycrystalline silicon layers;
- patterning each of said polycrystalline silicon layers into a plurality of polycrystalline silicon islands; and forming a source region, a channel region and a draft region gf said P-channel type thin film transistor in one of said polycrystalline silicon islands of one of said polycrystalline silicon layers and a source region, a channel region and a drain region of said N-channel thin film transistor in one of said polycrystalline silicon islands of the other of said polycrystalline silicon layers;
- wherein said laser line beam irradiating step irradiates said amorphous silicon layer with said laser line beams, so that polycrystalline silicon is grown from portions of said amorphous silicon layer close to edges of each of said laser line beams to portions of said amorphous silicon layers close to centers of each of said laser line beams; each of said polycrystalline silicon layers being divided into two regions at a line corresponding to the centers of said laser line beams.

6. The method as set forth in claim 5, wherein each of said polycrystalline silicon islands is located within either of the two regions of one of said polycrystalline silicon layers.

7. A method for manufacturing a P-channel thin film transistor and an N-channel thin film transistor, comprising the steps of:
- forming an amorphous silicon layer on an insulating substrate;
- irradiating said amorphous silicon layer with a plurality of laser line beams along a first direction, so that polycrystalline silicon is grown from portions of said amorphous silicon layer close to edges of each of said laser line beams to portions of said amorphous silicon layer close to a center of each of said laser line beams, thus forming a plurality of polycrystalline silicon layers each divided into two regions at a line corresponding to the center of each of said laser line beams;
- patterning either of the two regions of each of said polycrystalline silicon layers into a plurality of polycrystalline silicon islands and forming a source region, a channel region and a drain region of said P-channel type thin film transistor in either of the two regions of one of said polycrystalline silicon islands belonging to one of said polycrystalline silicon layers and a source region, a channel region and a drain region of said N-channel thin film transistor in either of the two regions of one of said polycrystalline silicon islands belonging to the other of said polycrystalline silicon layers along a second direction perpendicular to said first direction.

8. The method as set forth in claim 7, wherein said insulating substrate comprises a glass substrate.

* * * * *